(12) United States Patent
Ohlsson

(10) Patent No.: US 12,136,937 B2
(45) Date of Patent: Nov. 5, 2024

(54) DEVICE FOR TRANSFERRING HEAT BETWEEN A FIRST MODULE AND A SECOND MODULE

(71) Applicant: Huawei Technologies Co., Ltd., Shenzhen (CN)

(72) Inventor: Fredrik Ohlsson, Kista (SE)

(73) Assignee: Huawei Technologies Co., Ltd., Shenzhen (CN)

( * ) Notice: Subject to any disclaimer, the term of this patent is extended or adjusted under 35 U.S.C. 154(b) by 203 days.

(21) Appl. No.: 17/831,140

(22) Filed: Jun. 2, 2022

(65) Prior Publication Data

US 2022/0294478 A1 Sep. 15, 2022

Related U.S. Application Data

(63) Continuation of application No. PCT/EP2019/083326, filed on Dec. 2, 2019.

(51) Int. Cl.
*H04B 1/036* (2006.01)
*H05K 7/20* (2006.01)

(52) U.S. Cl.
CPC ......... *H04B 1/036* (2013.01); *H05K 7/20318* (2013.01); *H05K 7/20336* (2013.01)

(58) Field of Classification Search
CPC .......... F28D 15/00; F28D 15/02; F28D 15/04; F28D 15/043; F28D 15/046; F28D 15/06;
(Continued)

(56) References Cited

U.S. PATENT DOCUMENTS

| 2012/0168122 A1 | 7/2012 | Skepnek et al. |
| 2013/0033821 A1 | 2/2013 | Szczesny et al. |
| 2014/0090816 A1* | 4/2014 | Yang ...................... F28D 15/02 165/104.26 |

(Continued)

FOREIGN PATENT DOCUMENTS

| CN | 102073358 A | 5/2011 |
| CN | 102290523 A | 12/2011 |

(Continued)

OTHER PUBLICATIONS

"IEEE Standard for Information technology—Telecommunications and information exchange between systems Local and metropolitan area networks—Specific requirements Part 11: Wireless LAN Medium Access Control (MAC) and Physical Layer (PHY) Specifications," IEEE Std 802.11™—2016 (Revision of IEEE Std 802.Nov. 2012), Total 3534 pages, Institute of Electrical and Electronics Engineers, New York, New York (Dec. 2016).

*Primary Examiner* — Gordon A Jones
(74) *Attorney, Agent, or Firm* — Leydig, Voit & Mayer, Ltd.

(57) ABSTRACT

A device for transferring heat between a second module, for example an optical transceiver module, and a first module, for example a heat sink. The device comprises a holder for holding the second module, a first unit configured to be thermally coupled to the first module, and a second unit which is urged against the second module placed in the holder by a biasing apparatus. The first unit and the second unit are thermally coupled to one another through a heat-transferring apparatus such that an improved heat transfer can be provided between the first and second units, and hence between the second module and the first module. Furthermore, the disclosure also relates to an arrangement, including the device, and a network access node for a wireless communication system including any one of the device and the arrangement.

18 Claims, 6 Drawing Sheets

(58) Field of Classification Search
CPC ............ F28D 15/0266; F28D 15/0275; F28D 15/0283; H05K 7/20336; H05K 7/20318; H04B 1/036
See application file for complete search history.

(56) References Cited

U.S. PATENT DOCUMENTS

| | | |
|---|---|---|
| 2016/0093996 A1 | 3/2016 | Phillips |
| 2017/0142864 A1* | 5/2017 | Chanu .................. G02B 6/4268 |
| 2020/0076455 A1* | 3/2020 | Sharf .................. G02B 6/4277 |

FOREIGN PATENT DOCUMENTS

| | | | |
|---|---|---|---|
| CN | 104409913 A | 3/2015 | |
| EP | 1638143 A2 * | 3/2006 | ......... F28D 15/0241 |

* cited by examiner

DEVICE FOR TRANSFERRING HEAT BETWEEN A FIRST MODULE AND A SECOND MODULE

CROSS-REFERENCE TO RELATED APPLICATIONS

This application is a continuation of International Patent Application No. PCT/EP2019/083326, filed on Dec. 2, 2019, the disclosure of which is hereby incorporated by reference in its entirety.

TECHNICAL FIELD

The disclosure relates to a device for transferring heat between a first module and a second module. The disclosure also relates to an arrangement for cooling a second module, the arrangement including a device of the above-mentioned sort. Further, the disclosure relates to a network access node for a wireless communication system, wherein the network access node comprises any one of a device of the above-mentioned sort and an arrangement of the above-mentioned sort.

BACKGROUND

In many areas, for example within the field of telecommunications, components may require thermal cooling. This may for example be the case for components in a network access node for a wireless communication system, such as for example a base station. Thermal cooling involves a transfer of heat from the module or component which is to be cooled, e.g., to the ambient or to another module or component, such as an electrical active cooling device or a passive heat sink. A passive heat sink does not require electric power to transfer heat. In general, a heat sink may be seen as a passive heat exchanger configured to transfer heat from a heat-producing component to another medium, such as air or any other fluid medium, for example, a liquid. A heat sink can, for example, release the received heat partly or entirely to the ambient environment via cooling fins of a fin structure. Between the module or component to be cooled and an active cooling device or a heat sink, there may be structures and thermally insulating air gaps which impair the heat transfer to the active cooling device or heat sink.

SUMMARY

An objective of embodiments of the disclosure is to provide a solution which mitigates or solves the drawbacks and problems of conventional solutions.

The above and further objectives are solved by the subject matter of the independent claims. Further advantageous embodiments of the disclosure can be found in the dependent claims.

According to a first aspect of the disclosure, the above mentioned and other objectives are achieved with a device for transferring heat between a first module and a second module, the device comprising:
 a holder for holding the second module,
 a first unit configured to be thermally coupled to the first module,
 a second unit movable in relation to the first unit and the holder,
 a biasing apparatus for urging the second unit away from the first unit, thereby urging the second unit against the second module placed in the holder, and
 a liquid and vapor-based heat-transferring apparatus attached to the first unit and the second unit, wherein the heat-transferring apparatus thermally couples the second unit to the first unit.

An advantage of the device according to the first aspect is that the heat-transferring apparatus can improve the thermal coupling between the first unit and the second unit such that an efficient heat transfer between the first module and the second module can be provided. When the second module is a heat-generating module, the improved thermal coupling between the first unit and second unit provides an efficient heat transfer from the second module to the first module and hence an efficient cooling of the second module. The biasing apparatus ensures a suitable contact pressure for good thermal transfer between the second module and the second unit. Consequently, the heat transfer between the second module and the first module is improved and an improved heat dissipation is provided.

In an implementation form of a device according to the first aspect, the heat-transferring apparatus is a liquid-vapor phase-change heat-transferring apparatus. An advantage with this implementation form is that well-known principles of transferring heat based on evaporation and condensation can be used. Thereby, a reliable heat-transferring apparatus can be provided, and the manufacturing costs can be reduced.

In an implementation form of a device according to the first aspect, the heat-transferring apparatus is an elongated tubular heat-transferring apparatus. An advantage with this implementation form is an efficient design of the heat-transferring apparatus which improves the heat transfer and reduces the manufacturing costs.

In an implementation form of a device according to the first aspect, the heat-transferring apparatus forms a closed tube.

In an implementation form of a device according to the first aspect, the heat-transferring apparatus has an outer shell, wherein the heat-transferring apparatus at a hot interface is configured to turn a liquid inside the shell into a vapor inside the shell by allowing the liquid to absorb heat from the outer shell, whereupon the vapor travels along the heat-transferring apparatus to a cold interface, wherein the heat-transferring apparatus at the cold interface is configured to condense the vapor back into a liquid, and wherein the heat-transferring apparatus is configured to return the liquid to the hot interface by way of any one of capillary action and gravity. An advantage with this implementation form is that well-known principles of transferring heat based on evaporation and condensation can be used. Thereby, a reliable heat-transferring apparatus can be provided, and the manufacturing costs can be reduced.

In an implementation form of a device according to the first aspect, the heat-transferring apparatus comprises a heat pipe. An advantage with this implementation form is that a well-known product can be used. Thereby, a reliable heat-transferring apparatus can be provided, and the manufacturing costs can be reduced.

In an implementation form of a device according to the first aspect, the heat-transferring apparatus forms at least a part of a helical shape or forms a helical shape. An advantage with this implementation form is that the heat-transferring apparatus is able to distribute deflection and bending stress/moment such that the stress in the heat-transferring apparatus can be minimized. The heat-transferring apparatus can thereby handle larger deflections and meet higher mechanical tolerance requirements.

In an implementation form of a device according to the first aspect, the heat-transferring apparatus is part of the biasing apparatus, and wherein the helical heat-transferring apparatus is configured to urge the second unit away from the first unit, thereby urging the second unit against the second module placed in the holder. The biasing apparatus ensures a suitable contact pressure for good thermal transfer between the second module and the second unit. The biasing apparatus may comprise an elastic element or a resilient element (e.g. a spring) and may therefore be referred to herein also as a spring element or resilient element. An advantage with this implementation form is that the helical heat-transferring apparatus can provide or contribute to the force required to urge the second unit against the second module placed in the holder. Thereby, the design of the biasing apparatus can be simplified.

In an implementation form of a device according to the first aspect, the biasing apparatus comprises one or more compression springs. An advantage with this implementation form is that the biasing apparatus can be implemented using standard components which are reliable and inexpensive.

In an implementation form of a device according to the first aspect, the compression spring is located inside the helical shape of the heat-transferring apparatus. An advantage with this implementation form is that a compact and robust design of the biasing apparatus can be provided.

In an implementation form of a device according to the first aspect, the first unit is configured to be fixed in relation to the first module. "The first unit is configured to be fixed in relation to the first module" in the context of this embodiment means that the first unit is stationary in relation to the first module, i.e., the first unit does not move relative to the first module. An advantage with this implementation form is that a good thermal coupling between the first unit and the first module can be provided.

In an implementation form of a device according to the first aspect, wherein the holder comprises a compartment configured to receive and hold the second module. The compartment may further be configured to receive and hold the second module detachably.

In an implementation form of a device according to the first aspect, the device comprises a housing, which houses the compartment, and a printed circuit board, to which the housing is attached, wherein the compartment has a first opening for receiving the second module connectable to the printed circuit board, wherein the compartment has a second opening, and wherein the second unit comprises a protrusion, the protrusion being configured to engage the second opening and abut against the second module placed in the compartment. The embodiments of the device according to the disclosure are especially advantageous for such an implementation. Conventionally, an interface comprising a metal housing is often used for connecting a signal cable to a printed circuit board via a second module, for example, a transceiver module, held by a compartment in the housing. By the second opening and embodiments of the device according to the present disclosure, an improved heat transfer is provided between the second module and the second unit for reasons mentioned above.

In an implementation form of a device according to the first aspect, the second unit covers the second opening. A second opening in the compartment could increase the risk of electromagnetic interference (EMI) leakage from the second module, for example, the transceiver module, and from a connector electrically connecting the transceiver module to the printed circuit board. The electromagnetic interference leakage could for example influence an antenna nearby. Further, a second opening in the compartment could increase the risk of interference caused by signals from an antenna nearby or from other electrical components. However, when the second unit covers the second opening, electromagnetic interference shielding is provided. Thus, an improved heat transfer can be provided between the second module and the first module without an increased risk of electromagnetic interference leakage.

In an implementation form of a device according to the first aspect, the holder is configured to hold a second module which is a transceiver module to which a signal cable is connectable. The transceiver module is mechanically connectable to the signal cable. When the signal cable is connected to the transceiver module a signal connection is provided between the transceiver module and signal cable, i.e., a connection through which signal transmission is possible. The transceiver module may in turn be electrically connectable or connected to a printed circuit board (PCB). The transceiver module may be an optical transceiver module and the signal cable may be an optical signal cable, for example, an optical fiber cable. When in use, an optical transceiver module produces a substantial amount of heat which should be dissipated or transferred away from the optical transceiver module, and also away from a printed circuit board located close to the transceiver module. The heat is produced when the optical transceiver module converts optical signals to electrical signals. The electrical signals are then transmitted to the printed circuit board. Thus, for applications where the second module is a transceiver module, for example, an optical transceiver module, the embodiments of the device according to the disclosure are especially advantageous.

In an implementation form of a device according to the first aspect, the holder is configured to receive and hold a second module which is any module from the group comprising: a small form-factor pluggable (SFP) module and a quad small form-factor pluggable (QSFP) module.

An advantage with this implementation form is that a flexible mechanical connection for the second module is provided involving the known concepts SFP and QSFP.

According to a second aspect of the disclosure, the above mentioned and other objectives are achieved with an arrangement for cooling a second module, the arrangement comprises the device according to any one of the above implementations, and the first module which comprises a heat sink.

An advantage of the arrangement according to the second aspect is that an improved heat transfer between a second module placed in the holder of the device and the first module in the form of a heat sink is provided. Further advantages correspond to the advantages of the device and its embodiments mentioned above or below.

In an implementation form of an arrangement according to the second aspect, the arrangement comprises the second module.

An advantage of this implementation form is that an improved heat transfer between the second module and the first module in the form of a heat sink is provided. Further advantages correspond to the advantages of the device and its embodiments mentioned above or below.

In an implementation form of an arrangement according to the second aspect, the arrangement comprises two devices, each device according to any one of the above implementations.

An advantage of this implementation form is that an improved heat transfer between two second modules placed in the holder of the respective device and the first module in the form of a heat sink is provided. Further advantages correspond to the advantages of the device and its embodiments mentioned above or below.

According to a third aspect of the disclosure, the above mentioned and other objects are achieved with a network access node for a wireless communication system, wherein the network access node comprises any one of the device or the arrangement according to any of the above- or below-mentioned embodiments. Advantages of the network access node correspond to the advantages of the device and the arrangement and their embodiments mentioned above or below. The network access node may comprise a base station.

Further applications and advantages of the embodiments of the disclosure will be apparent from the following detailed description.

BRIEF DESCRIPTION OF THE DRAWINGS

The appended drawings are intended to clarify and explain different embodiments of the disclosure, in which:

FIG. 1B is an exploded view of the two devices;

DETAILED DESCRIPTION

In order to cool a module, for example, an electrical component, an electrical active cooling device or a passive heat sink may be used. The use of an electrical active cooling device to cool the module has the disadvantage that the electrical active cooling device consumes power to lower the temperature. This leads to high costs and to the generation of heat load in other parts or components close to the module.

Another disadvantage with conventional cooling is that air gaps may be present between the module to be cooled and the electrical active cooling device or the passive heat sink. Air gaps introduces high thermal resistance and makes it more difficult to cool the module. In order to avoid air gaps a thermally conductive filling material, which provides and facilitates the heat transfer, may be placed between the module to be cooled and the active cooling device or the passive heat sink. Conventional thermal interface materials are resilient to a certain extent to be able to expand and fill the air gaps but may lose their resilient character completely or to some degree after some time in a compressed state. Thus, the thermal interface material may, for example, not properly expand and fill the air gaps when the module is removed and replaced or reintroduced after inspection. This leads to thermally insulating air gaps which reduces the heat transfer between the module and the electrical active cooling device or the passive heat sink. There may hence be a temperature increase in the module, which results in an increased risk of overheating and a shortened lifetime of the module.

According to embodiments of the disclosure, a device for transferring or conducting heat between a first module and a second module is disclosed. The device improves the heat transfer between the first module and the second module and can address manufacturing variances with regard to the first module and the second module. The device further maintains its flexibility over time.

Figure 1A:
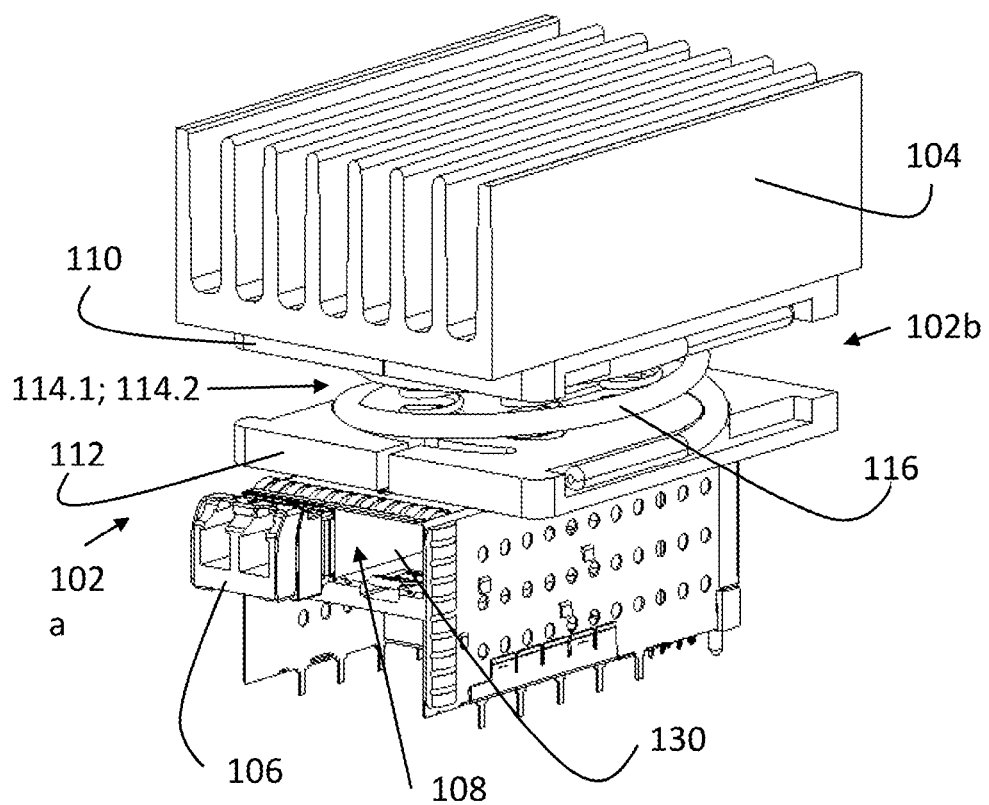
FIGS. 1A-1C are schematic views of two devices according to an embodiment of the disclosure, where
Figure 1B:
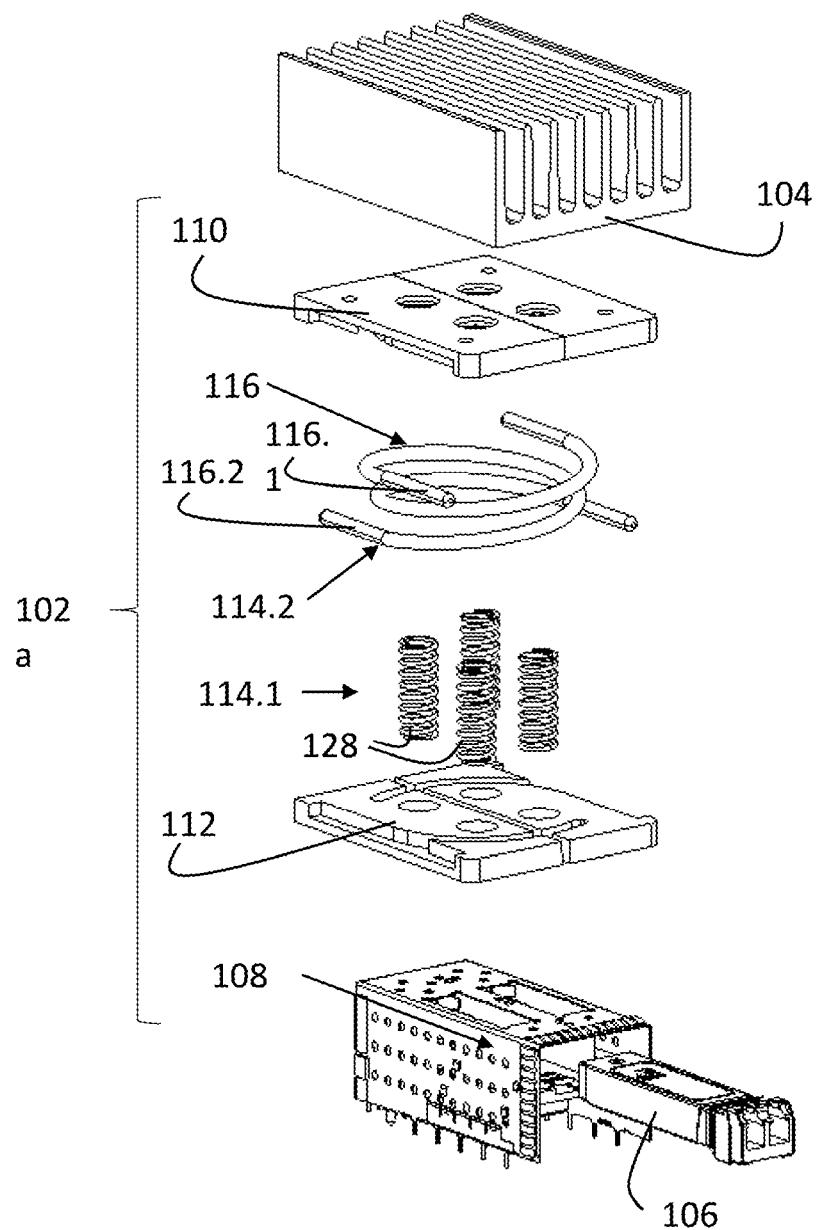
Figure 1C:
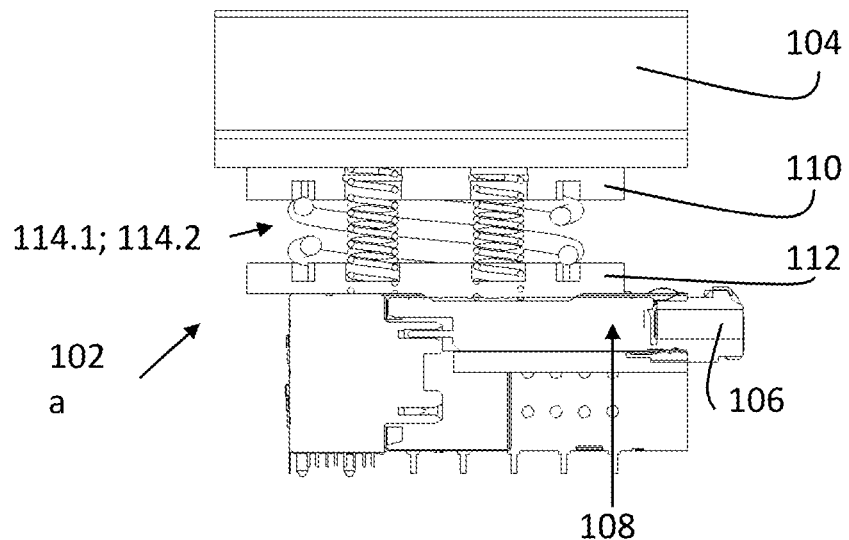

FIGS. 1A-1C schematically illustrates two devices 102 according to embodiments of the disclosure, a first device 102a and a second device 102b. Each of the first device 102a and the second device 102b is configured to transfer or conduct heat between a first module 104 and a respective second module 106. Only one second module 106 is shown in FIGS. 1A-1C. The configuration and functionality of the two devices 102a, 102b will now be described with reference to the first device 102a.

In the embodiment shown in FIGS. 1A-1C, the second module 106 is a heat-generating module and the first device 102a hence transfers heat from the second module 106 to the first module 104. The first device 102a comprises a holder 108 for holding the second module 106. The first device 102a further comprises a first unit 110 configured to be thermally coupled to the first module 104. By thermal coupling is meant that there is a heat transfer between the first unit 110 and the first module 104, or in other words, that there is a heat-conducting communication between the first unit 110 and the first module 104. The first unit 110 may be thermally coupled to the first module 104, for example, through direct physical abutment or via additional thermally conductive material.

In embodiments of the first device 102a, the first unit 110 is configured to be fixed, or in other words stationary, in relation to the first module 104 such that the first unit 110 does not move relative to the first module 104. The first unit 110 may further be configured to be connected to the first module 104. The first unit 110 may be connected/attached to the first module 104 by using for example a mechanical fastening means or an adhesive. Alternatively, the first unit 110 may be integral with the first module 104, i.e., formed as a unit with the first module 104. When the first unit 110 is attached to the first module 104, a thermal interface material (TIM) may be arranged between the first unit 110 and the first module 104 to further reduce thermal resistance between them.

The first device 102a further comprises a second unit 112 movable in relation to the first unit 110 and the holder 108. The first device 102a also includes a biasing apparatus 114a, 114b for urging (or forcing or biasing) the second unit 112 away from the first unit 110, thereby urging the second unit 112 against the second module 106 placed in the holder 108, as illustrated in FIG. 1C. Thus, the biasing apparatus 114a, 114b urges the second unit 112 into contact with the second module 106 such that a thermal coupling is provided between the second unit 112 and the second module 106. The second unit 112 may be thermally coupled to the second module 106 through direct physical abutment or via additional thermally conductive material.

Furthermore, the first device 102a comprises a liquid- and vapor-based heat-transferring apparatus 116 attached to the first unit 110 and the second unit 112. The heat-transferring apparatus 116 may also be denoted a heat transfer apparatus 116. The heat-transferring apparatus 116, or heat transfer apparatus 116, thermally couples the second unit 112 to the first unit 110. Thus, the heat-transferring apparatus 116 provides a heat transfer between the second unit 112 and the first unit 110.

With reference to FIG. 1B, the heat-transferring apparatus 116 may have a first end 116*a* which is configured to be attached to the first unit 110. Further, the heat-transferring apparatus 116 may have a second end 116*b* which is configured to be attached to the second unit 112. The heat-transferring apparatus 116 may be attached to the first unit 110 and the second unit 112, respectively, using, for example, soldering, brazing, pressing, a mechanical fastening means, or an adhesive.

As illustrated in FIGS. 1A-1C, the second device 102*b* comprises parts corresponding to the above described parts of the first device 102*a*. The first and second devices 102*a*, 102*b* may be independent of each other or may be partly connected or integrated with each other. In other words, the first and second devices 102*a*, 102*b* may operate independently from each other or may co-operate.

Figure 2:
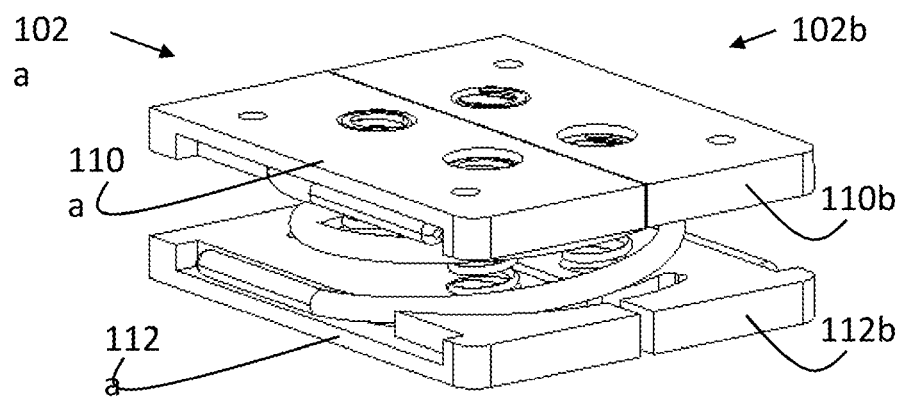
FIG. 2 is a schematic perspective view of a first and a second device according to an embodiment of the disclosure.

FIG. 2 schematically illustrates parts of the first and second devices 102*a*, 102*b* according to an embodiment of the disclosure where the first and second devices 102*a*, 102*b* are partly connected. With reference to FIG. 2, the first unit 110*a* of the first device 102*a* and the first unit 110*b* of the second device 102*b* are connected or attached to each other. The first units 110*a*, 110*b* may be fixed in relation to each other such that they do not move relative to each other. Thus, the first units 110*a*, 110*b* may be kept at the same level in relation to one another and, for example, be connected or attached to the same first module 104. However, the second unit 112*a* of the first device 102*a* and the second unit 112*b* of the second device 102*b* are not directly connected or attached to one another. Instead they 112*a*, 112*b* are arranged separate from each other. In this way, the second units 112*a*, 112*b* may move independently between their respective first unit 110*a*; 110*b* and the holder 108. The fact that the second units 112*a*, 112*b* can move independently from each other ensures that a good contact pressure and hence a good thermal transfer can be achieved between the second unit 112*a*; 112*b* and its respective second module 106 held in the holder 108.

In some embodiments, the heat-transferring apparatus 116 may be a liquid-vapor phase-change heat-transferring apparatus 116, such as for example a two-phase cooling system based on evaporation and condensation. The heat-transferring apparatus 116 may for example comprises a heat pipe. A heat pipe per se is known and provides cooling based on liquid-vapor phase-change.

Figure 3:
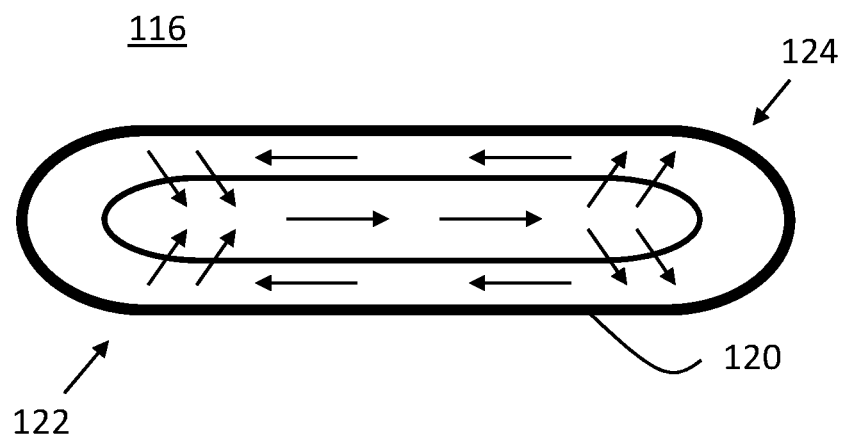
FIG. 3 is a schematic cross-section view of a heat-transferring apparatus according to an embodiment of the disclosure.

FIG. 3 schematically illustrates the heat-transferring apparatus 116 according to an embodiment of the disclosure, where the heat-transferring apparatus 116 is based on liquid-vapor phase-change. With reference to FIG. 3, the heat-transferring apparatus 116 has an outer shell 120, a hot interface 122 and a cold interface 124. The heat-transferring apparatus 116 is configured to, at the hot interface 122, turn a liquid inside the shell 120 into a vapor inside the shell 120 by allowing the liquid to absorb heat from the outer shell 120, whereupon the vapor travels along the heat-transferring apparatus 116 to the cold interface 124. At the cold interface 124, the heat-transferring apparatus 116 is configured to condense the vapor back into a liquid, and to return the liquid to the hot interface 122 by way of any one of capillary action and gravity. Heat is hence removed from the hot interface 122 and transferred to the cold interface 124 of the heat-transferring apparatus 116. In this way, the heat-transferring apparatus 116 transfers heat from one end of the heat-transferring apparatus 116 to an opposite end of the heat-transferring apparatus 116. With reference to FIG. 1B, the heat-transferring apparatus 116 may hence transfer heat from the second end 116*b* attached to the second unit 112 to the first end 116*a* attached to the first unit 110. The hot interface 122 may be a surface for vaporising the liquid into a vapour. The cold interface 124 may be a surface for condensing the vapour into a liquid.

The heat-transferring apparatus 116 may be an elongated tubular heat-transferring apparatus 116. The tubular shape of the heat-transferring apparatus 116 may be closed, as illustrated, for example, in FIG. 3. Hence, the heat-transferring apparatus 116 may in some embodiments form a closed tube 116. In a non-limiting example, the tubular shape or the closed tube may have an essentially circular cross-section with a diameter of about 3 mm. However, the tubular shape or the closed tube may in some embodiments instead have an oval or flat shape with other dimensions.

According to embodiments, the heat-transferring apparatus 116 forms at least a part of a helical shape or forms a helical shape. The helical shape may correspond to a curve in three-dimensional space and may also be referred to as a coil shape. The fact that the heat-transferring apparatus 116 forms at least a part of a helical shape may mean that the heat-transferring apparatus 116 forms less than one complete helix turn, e.g., only half a helix turn. The helical shape of the heat-transferring apparatus 116 may have different dimensions such that the heat-transferring apparatus 116 may be adapted to be used in different applications. For example, the pitch, i.e., the height of one complete helix turn, of the helical shape may be adapted based on the distance between the first module 104 and the holder 108 and/or the mechanical properties of the heat-transferring apparatus 116.

In the embodiment shown in FIGS. 1A-1C, the heat-transferring apparatus 116 is a helical coil spring forming one complete helix turn. The pitch of the helical coil spring is selected such that the distance between the first module 104 and the holder 108 can be bridged. One end 116*a* of the helical coil spring is attached to the first unit 110 and the second end 116*b* is attached to the second unit 112.

Figure 4:
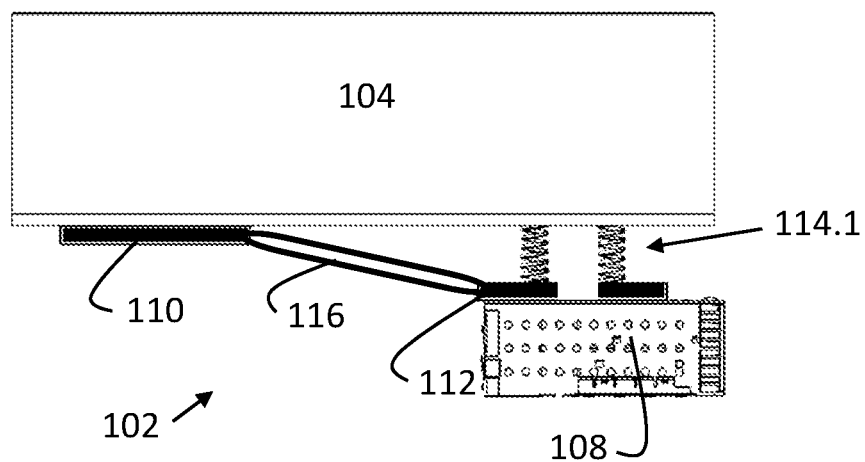
FIG. 4 is a schematic side view of a device according to an embodiment of the disclosure.

According to embodiments of the disclosure, the heat-transferring apparatus 116 may form other shapes than a helical shape. The heat-transferring apparatus 116 may for example be at least partly straight, form a U-shape or form other geometrical shapes. FIG. 4 schematically illustrates a device 102 comprising a heat-transferring apparatus 116 with an essentially straight shape. The position of the first unit 110 relative to the second unit 112 may be adapted to the shape of the heat-transferring apparatus 116 such that the heat-transferring apparatus 116 can be attached to both the first unit 110 and the second unit 112. As illustrated in FIG. 4, when the heat-transferring apparatus 116 has an essentially straight shape, the first unit 110 may be arranged at an distance from the second unit 112, where the distance is selected such that the heat-transferring apparatus 116 is able to handle bending moments at its two attached ends, where the bending moments arise from mechanical movements of for example the second unit 112.

As previously described, the biasing apparatus 114*a*, 114*b* is configured to urge the second unit 112 away from the first unit 110, thereby urging the second unit 112 against the second module 106 placed in the holder 108. With reference to FIGS. 1C, the biasing apparatus 114*a*, 114*b* hence urges the second unit 112 towards contact with the second module 106 such that a good thermal coupling is achieved between the second unit 112 and the second module 106. Furthermore, the biasing apparatus 114*a*, 114*b* may be arranged such that the entire area of a first surface of the second unit 112 is urged against the second module 106. In this way an even pressure over the entire contact surface between the second unit 112 and the second module 106 can be achieved.

The biasing apparatus 114a, 114b may comprise one or more compression springs 128. The one or more compression springs 128 may comprises any compression spring from the group comprising: a helical spring, a volute spring, a conical spring, a hollow tubing spring, and a spring washer. The location of the one or more compression springs 128 may be selected such that a stable movement of the second unit 112 between the first unit 110 and the holder 108 can be achieved and further such that an even pressure over the entire contact surface between the second unit 112 and the second module 106 can be achieved.

With reference to FIGS. 1A-1C, the biasing apparatus 114.1 may comprise two compression springs 128. In FIG. 1B, four compression springs 128 are shown since two devices 102a, 102b are shown. The compression springs 128 may be located inside the helical shape of the heat-transferring apparatus 116. In this way the compression springs may be at least partly covered by the heat-transferring apparatus 116. However, the compression springs 128 may in embodiments instead be located outside the helical shape of the heat transferring apparatus 116.

When the heat-transferring apparatus 116 is resilient for example by having a helical shape and/or comprising at least partly a resilient material, the heat-transferring apparatus 116, 114b may be part of the biasing apparatus 114a, 114b. In such embodiments, the helical heat-transferring apparatus 116, 114b is hence configured to urge the second unit 112 away from the first unit 110, thereby urging the second unit 112 against the second module 106 placed in the holder 108. The resilience of the heat-transferring apparatus 116 may be such that the heat-transferring apparatus 116 can urge the second unit 112 against the second module 106 without the need of any compression spring 128. Thus, the biasing apparatus 114b may in some embodiments only comprise the heat-transferring apparatus 116.

According to embodiments of the disclosure, the holder 108 may comprise a compartment 130 configured to receive and hold the second module 106. In the embodiment shown in FIGS. 1A-1C, the holder 108 comprises two compartments 130, where each compartment 130 can receive and hold one second module 106. However, the holder 108 may have fewer or more compartments 130. In FIG. 1A, the compartment 130 to the right is illustrated without a second module 106 while the compartment 130 to the left is illustrated with a second module 106 received and held therein. The compartment 130 may be configured to detachably secure the second module 106 such that the second module 106 can be replaced or removed and re-inserted into the compartment 130.

Figure 5:
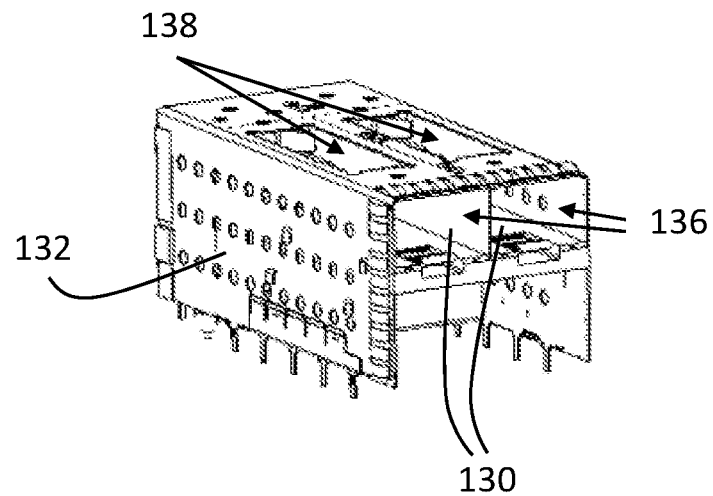
FIG. 5 is a schematic perspective view of a housing according to an embodiment of the disclosure.

In some embodiments, the compartment 130 is housed in a housing 132 as schematically illustrated in FIG. 5. Thus, the device 102 may in some embodiments comprise a housing 132. The housing 132 houses the compartment 130 and is attachable to a printed circuit board (not shown in the figures). The housing 132 may also be referred to as a case or casing and may for example be a metal casing. The housing 132 illustrated in FIG. 5 comprises two compartments 130, each compartment 130 having a first opening 136 for receiving the second module 106 connectable to the printed circuit board. Each compartment 130 further has a second opening 138 which exposes at least a part of the second module 106 when held in the compartment 130.

Figure 6:
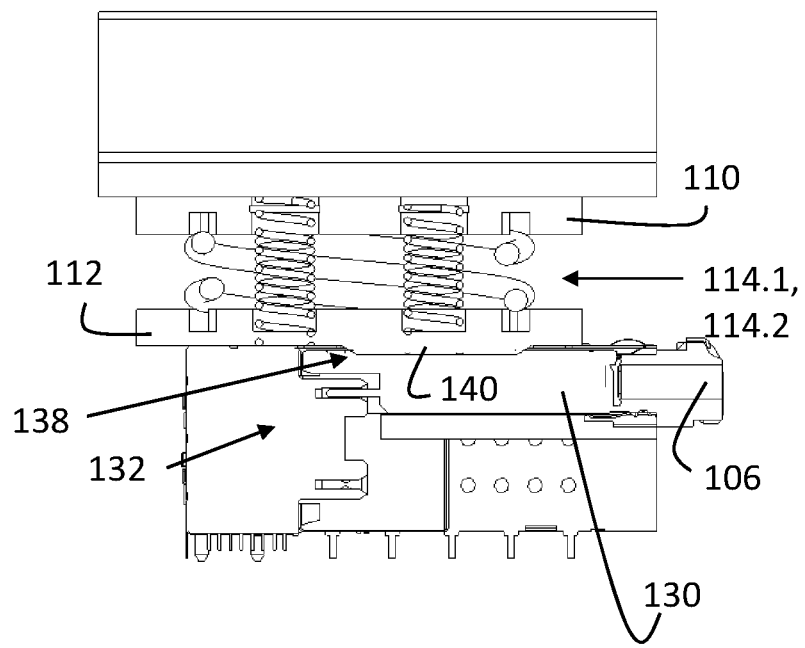
FIG. 6 is schematic cross-section view of a device according to an embodiment of the disclosure.

With reference to FIG. 6, the second opening 138 of the compartment 130 may face the second unit 112 and the second unit 112 may comprise a protrusion/projection/boss 140 configured to engage the second opening 138 and abut against the second module 106 placed in the compartment 130. The second unit 112 is thus brought into physical and thermal contact with the second module 106 held in the compartment 130. The physical and thermal contact between the second unit 112 and the second module 106 may in some embodiments be provided via additional thermally conductive material. The protrusion 140 of the second unit 112 together with the biasing apparatus 114a, 114b urging the second unit 112 away from the first unit 110 ensures a good thermal connection between the second unit 112 and the second module 106 held in the compartment 130 of the housing 132. To allow the second module 106 to easily be inserted and removed from the compartment 130, the protrusion 140 of the second unit 112 may have tampered edges, as indicated in FIG. 6. This provides sliding surfaces between the protrusion 140 and the second module 106 and hence prevents the second module 106 to be caught by an edge of the protrusion 140 during insertion and removal of the second module 106.

The second unit 112 may cover the second opening 138. When the second unit 112 covers the second opening 138, shielding against electromagnetic interference can be provided. This reduces the risk of electromagnetic interference (EMI) leakage to and/or from the second module 106 through the second opening 138. Thereby, the risk that the second module 106 causes interference to an antenna or other electrical components nearby is reduced, as well as the risk of interference in the second module 106 caused by signals from an antenna or from other electrical components nearby. Thus, an improved heat transfer can be provided between the second module 106 and the first module 104 without an increased risk of electromagnetic interference leakage.

According to embodiments of the disclosure the holder 108 may be configured to hold a second module 106 which is a transceiver module to which a signal cable is connectable. The second module 106 may for example be an optical transceiver module to which an optical signal cable, for example, an optical fiber cable, is connected. However, the transceiver module may also be configured to be connectable to an electrical signal cable. The device 102 according to the embodiments of the present disclosure may be especially advantageous for applications where the second module 106 is an optical transceiver module, since when converting optical signals from the optical signal cable to electrical signals for transmission to the printed circuit board, the optical transceiver module generates a substantial amount of heat, which should be dissipated or transferred away from the optical transceiver module, to protect the optical transceiver module from heat, since the optical transceiver module is sensitive to high temperatures. The reliability and lifetime of a transceiver module is related to the module temperature. Typical allowed maximum temperatures for the optical transceiver module is 75° C. or 85° C. The temperature of the optical transceiver module can be reduced by 2-5° C., but also by more, for example, by 10-20° C., if a thermally insulating air gap or air pocket is avoided by the use of the device 102.

The holder 108 may further be configured to receive and hold a second module 106 which is any module from the group comprising: a small form-factor pluggable (SFP) module and a quad small form-factor pluggable (QSFP) module. The holder 108 may hence be an SFP or QSFP housing configured to receive the SFP module or the QSFP module, respectively. The signal cable, which may be an optical fibre cable, may be connectable to the SFP or QSFP module. SFP and QSFP per se are known to the person skilled in the art and are thus not further described in this disclosure.

Figure 7:
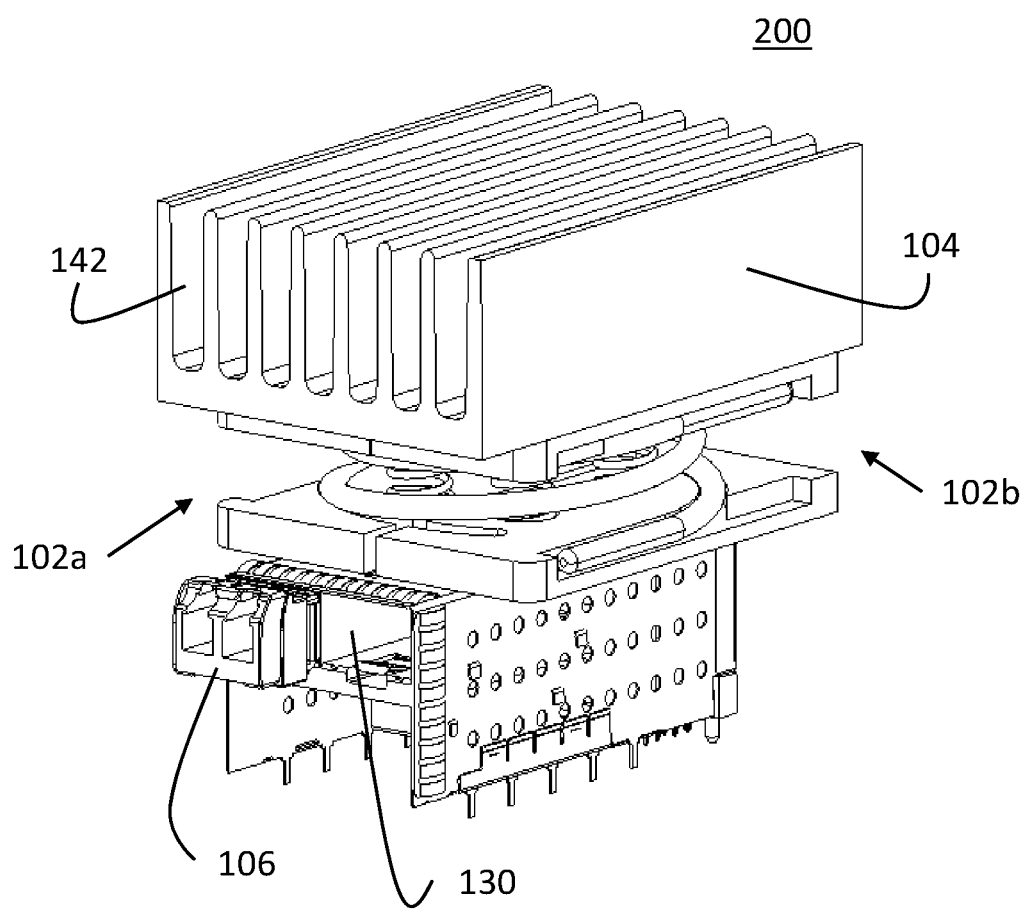
FIG. 7 is a schematic perspective view of an arrangement according to an embodiment of the disclosure.

The embodiments of the present disclosure also include an arrangement 200 for cooling a second module 106. FIG. 7 shows the arrangement 200 according to an embodiment of the disclosure. The arrangement 200 comprises a first device 102a according to any one of the embodiments disclosed above, and a first module 104 which comprises a heat sink 142. With reference to FIG. 7, the first module 104 may be in the form of a heat sink 142 having cooling fins for heat dissipation. The arrangement 200 may further comprise the second module 106 held in the first device 102a. The arrangement 200 improves the heat transfer from the second module 106 to the first module 104 by means of embodiments of the first device 102a. Consequently, the arrangement 200 can provide an improved heat dissipation.

With reference to FIG. 7, the arrangement 200 may further comprise a second device 102b according to any one of the embodiments disclosed above. Thus, the arrangement 200 may in embodiments comprise two devices 102a, 102b. Each device 102a, 102b may be structured according to any one of the embodiments disclosed above. Furthermore, each device 102a, 102b may provide cooling of a respective second module 106. In FIG. 7, only one second module 106 is illustrated. The first device 102a provides heat transfer from and hence cooling of this second module 106. The second device 102b is configured to provide cooling of an additional second module 106 when placed in the empty compartment 130 to the right in the holder 108 in FIG. 7.

The embodiments of the present disclosure also include a network access node for a wireless communication system. The network access node comprises any one of the device 102 and the arrangement 200 according to any one of the embodiments disclosed above. The network access node may comprise a base station, for example, a base radio station. The network access node may include one or more antennas. The base station may have a housing which houses the antenna. Alternatively, the antenna is mounted outside the housing of the base station, for example with a distance to the housing of the base station. The antenna may in embodiments be connectable to the printed circuit board comprised in the device 102 via a suitable cable. By means of embodiments of the device 102 and/or embodiments of the arrangement 200 an improved heat dissipation can be provided in the network access node.

The network access node herein may also be denoted as a radio network access node, an access network access node, an access point, or a base station, e.g., a Radio Base Station (RBS), which in some networks may be referred to as transmitter, "gNB", "gNodeB", "eNB", "eNodeB", "NodeB" or "B node", depending on the technology and terminology used. The radio network access nodes may be of different classes such as, e.g., a macro eNodeB, a home eNodeB, or a pico base station, based on transmission power and thereby also cell size. The radio network access node can be a Station (STA), which is any device that contains an IEEE 802.11-conformant Media Access Control (MAC) and Physical Layer (PHY) interface to the Wireless Medium (WM). The radio network access node may also be a base station corresponding to the fifth generation (5G) wireless systems.

Finally, it should be understood that the disclosure is not limited to the embodiments described above, but also relates to and incorporates all embodiments within the scope of the appended independent claims.

What is claimed is:

1. An apparatus for transferring heat, the apparatus comprising:
a holder including two or more compartments, each compartment of the two or more compartments configured to hold a second module,
two or more first units configured to be thermally coupled to a first module, wherein the two or more first units are connected to each other and fixed relative to the first module,
two or more second units, each second unit of the two or more second units movable in relation to a corresponding one of the two or more first units and the holder, wherein the two or more second units are not connected to each other and may move independently relative to the corresponding one of the two or more first units and the holder,
at least one biasing apparatus configured to urge each of the two or more second units away from the corresponding first units, thereby urging the two or more second units against a corresponding second module placed in one compartment of the two or more compartments included in the holder, and
a heat-transferring apparatus attached to the two or more first units and the two or more second units, wherein the heat-transferring apparatus thermally couples the two or more second units to the two or more first units, and wherein the heat-transferring apparatus transfers heat via at least one of a liquid or a vapor.

2. The apparatus according to claim 1, wherein the heat-transferring apparatus is a liquid-vapor phase-change heat-transferring apparatus.

3. The apparatus according to claim 1, wherein the heat-transferring apparatus is an elongated tubular heat-transferring apparatus.

4. The apparatus according to claim 1, wherein the heat-transferring apparatus forms a closed tube.

5. The apparatus according to claim 1, wherein the heat-transferring apparatus has an outer shell, wherein the heat-transferring apparatus at a hot interface is configured to turn the liquid inside the outer shell into the vapor inside the outer shell by allowing the liquid to absorb heat from the outer shell, wherein the vapor travels along the heat-transferring apparatus to a cold interface, wherein the heat-transferring apparatus at the cold interface is configured to condense the vapor back into the liquid, and wherein the heat-transferring apparatus is configured to return the liquid to the hot interface by way of any one of capillary action and gravity.

6. The apparatus according to claim 1, wherein the heat-transferring apparatus comprises a heat pipe.

7. The apparatus according to claim 1, wherein the heat-transferring apparatus forms at least a part of a helical shape.

8. The apparatus according to claim 1, wherein the heat-transferring apparatus forms a helical shape with at least one complete helical turn.

9. The apparatus according to claim 8, wherein the heat-transferring apparatus is part of the at least one biasing apparatus, and wherein the heat-transferring apparatus is configured to urge the two or more second units away from the two or more first units, thereby urging the two or more second units against the second module placed in the holder.

10. The apparatus according to claim 1, wherein the at least one biasing apparatus comprises one or more compression springs.

11. The apparatus according to claim 10, wherein the one or more compression springs are located inside a helical shape of the heat-transferring apparatus.

12. The apparatus according to claim 1, wherein each compartment of the two or more compartments include a first opening for receiving the corresponding second module and a second opening, wherein each second unit comprises a protrusion, the protrusion being configured to engage the second opening and abut against the corresponding second module in the compartment.

13. The apparatus according to claim 12, wherein each second unit covers the second opening of a corresponding compartment.

14. The apparatus according to claim 1, wherein the holder is configured to hold a transceiver which is connectable to a signal cable.

15. The apparatus according to claim 1, wherein the holder is configured to receive and hold any module from the group comprising: a small form-factor pluggable (SFP) module or a quad small form-factor pluggable (QSFP) module.

16. An arrangement for cooling two or more pluggable modules disposed in a holder, the arrangement comprising:
a heat sink; and
an apparatus configured to transfer heat between the heat sink and the two or more pluggable devices,
wherein the apparatus comprises:
the holder for holding the two or more pluggable modules,
two or more first units configured to be thermally coupled to the heat sink, wherein the two or more first units are connected to each other and fixed relative to the heat sink,
two or more second units, each second unit of the two or more second units movable in relation to a corresponding one of the two or more first units and the holder, wherein the two or more second units are not connected to each other and may move independently relative to the corresponding one of the two or more first units and the holder,
at least one biasing apparatus configured to urge each of the two or more second units away from the corresponding first units, thereby urging the two or more second units against a corresponding second module in one compartment of the two or more compartments included in the holder, and
a heat-transferring apparatus attached to the two or more first units and the two or more second units, wherein the heat-transferring apparatus thermally couples the two or more second units to the two or more first units, and wherein the heat-transferring apparatus transfers heat via at least one of a liquid or a vapor.

17. The arrangement according to claim 16, wherein the heat-transferring apparatus is a liquid-vapor phase-change heat-transferring apparatus.

18. The arrangement according to claim 16, wherein the heat-transferring apparatus is an elongated tubular heat-transferring apparatus.

* * * * *